(12) United States Patent
Asano et al.

(10) Patent No.: US 10,505,055 B2
(45) Date of Patent: Dec. 10, 2019

(54) PHOTOELECTRIC CONVERSION ELEMENT

(71) Applicant: SHARP KABUSHIKI KAISHA, Sakai, Osaka (JP)

(72) Inventors: Naoki Asano, Sakai (JP); Masamichi Kobayashi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/756,061

(22) PCT Filed: Aug. 29, 2016

(86) PCT No.: PCT/JP2016/075121
§ 371 (c)(1),
(2) Date: Feb. 27, 2018

(87) PCT Pub. No.: WO2017/038733
PCT Pub. Date: Mar. 9, 2017

(65) Prior Publication Data
US 2018/0248054 A1    Aug. 30, 2018

(30) Foreign Application Priority Data
Aug. 31, 2015   (JP) .................................. 2015-170647

(51) Int. Cl.
*H01L 31/0224*  (2006.01)
*H01L 31/0747*  (2012.01)
*H01L 31/075*   (2012.01)

(52) U.S. Cl.
CPC .. *H01L 31/022416* (2013.01); *H01L 31/0224* (2013.01); *H01L 31/075* (2013.01); *H01L 31/0747* (2013.01); *Y02E 10/50* (2013.01)

(58) Field of Classification Search
CPC ......... H01L 31/0224; H01L 31/022425; H01L 31/022416; H01L 31/022441; H01L 31/02245; H01L 31/0747; H01L 31/0508
See application file for complete search history.

(56) References Cited

U.S. PATENT DOCUMENTS

2009/0314346 A1\* 12/2009 Hishida ............. H01L 31/02245
136/258
2012/0138128 A1   6/2012 Wu et al.

FOREIGN PATENT DOCUMENTS

JP       S64-082570 A      3/1989
JP       2013-219065 A    10/2013

\* cited by examiner

*Primary Examiner* — Thanhha S Pham
(74) *Attorney, Agent, or Firm* — ScienBiziP, P.C.

(57) ABSTRACT

A photoelectric conversion element includes an n-type semiconductor substrate, a p-type amorphous semiconductor film on the side of a first surface and side surface of the semiconductor substrate, an n-type amorphous semiconductor film on the first surface side of the semiconductor substrate, a p-electrode on the p-type amorphous semiconductor film, and an n-electrode on the n-type amorphous semiconductor film. The p-electrode is located on the p-type amorphous semiconductor film, which is placed on the first surface side and side surface of the semiconductor substrate.

4 Claims, 5 Drawing Sheets

PHOTOELECTRIC CONVERSION ELEMENT

TECHNICAL FIELD

This application claims priority to Japanese Patent Application No. 2015-170647 filed on Aug. 31, 2015, the entire contents of which are incorporated by reference herein.

The present invention relates to a photoelectric conversion element.

BACKGROUND ART

In recent years, solar cells directly converting solar energy into electrical energy have been increasingly expected as next-generation energy sources particularly from the viewpoint of global environmental issues. In particular, solar cells that are most commonly manufactured and marketed at present have a configuration in which an electrode is placed on each of a light-receiving surface on which sunlight is incident and a back surface which is opposite to the light-receiving surface.

However, in the case of forming an electrode on a light-receiving surface, the amount of incident sunlight is reduced by an amount corresponding to the area of the electrode because sunlight is reflected and absorbed by the electrode. Therefore, a back contact-type solar cell in which electrodes are placed only on a back surface is being developed (refer to, for example, Patent Literature 1).

FIG. 15 shows a schematic sectional view of a conventional back contact-type solar cell described in Patent Literature 1. The back contact-type solar cell shown in FIG. 15 has a configuration in which an i-type amorphous semiconductor layer $117i$, an n-type amorphous semiconductor layer $117n$, and an insulating layer 116 are stacked on a light-receiving surface of a crystalline semiconductor substrate 111 having an n- or p-conductivity type in that order.

An IN stack 112 is placed on the back surface of the crystalline semiconductor substrate 111. The IN stack 112 has a configuration in which an i-type amorphous semiconductor layer $112i$ and an n-type amorphous semiconductor layer $112n$ are stacked on the crystalline semiconductor substrate 111 in that order.

Furthermore, an IP stack 113 is placed on the back surface of the crystalline semiconductor substrate 111. The IP stack 113 has a configuration in which an i-type amorphous semiconductor layer $113i$ and a p-type amorphous semiconductor layer $113p$ are stacked on the crystalline semiconductor substrate 111 in that order.

An n-side electrode 114 and p-side electrodes 115 are formed as described below. That is, a conductive layer (not shown) is formed over the back surface of the crystalline semiconductor substrate 111 by a thin-film formation process such as a CVD (chemical vapor deposition) process including a plasma CVD process or a sputtering process. Next, the conductive layer is divided by a lithographic process or the like. Thereafter, a coating layer is formed on the conductive layer. Incidentally, the n-side electrode 114 and the p-side electrodes 115 are electrically separated by trenches 119 placed on an insulating layer 118 on the back surface of the crystalline semiconductor substrate 111.

As shown in FIG. 15, in the conventional back contact-type solar cell, the n-side electrode 114 and the p-side electrodes 115 are not placed in a peripheral portion $110a2$ of the back surface of the crystalline semiconductor substrate 111 but are placed only in a region $110a1$ excluding the peripheral portion $110a2$. This is because the peripheral portion $110a2$, which is not provided with any electrode, is necessary as a region for fixing the crystalline semiconductor substrate 111 during the formation of the n-side electrode 114 and the p-side electrodes 115.

CITATION LIST

Patent Literature

PTL 1: Japanese Unexamined Patent Application Publication No. 2013-219065

SUMMARY OF INVENTION

Technical Problem

However, in this technical field, the photoelectric conversion efficiency is required to be increased as compared to that of conventional back contact-type solar cells.

Solution to Problem

An embodiment disclosed herein provides a photoelectric conversion element including an n-type semiconductor substrate, a p-type amorphous semiconductor film on the side of a first surface and side surface of the semiconductor substrate, an n-type amorphous semiconductor film on the first surface side of the semiconductor substrate, a p-electrode on the p-type amorphous semiconductor film, and an n-electrode on the n-type amorphous semiconductor film. The p-electrode is located on the p-type amorphous semiconductor film, which is placed on the first surface side and side surface of the semiconductor substrate.

Advantageous Effects of Invention

According to an embodiment disclosed herein, the photoelectric conversion efficiency can be increased as compared to that of conventional back contact-type solar cells.

DESCRIPTION OF EMBODIMENTS

Figure 1:
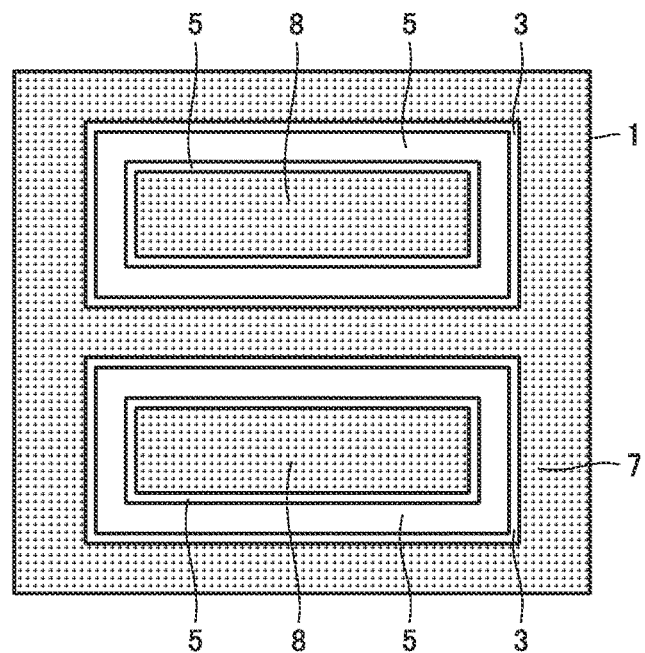
FIG. 1 is a schematic enlarged plan view of the back surface of a heterojunction back-contact cell according to Embodiment 1.

A heterojunction back-contact cell according to each of Embodiments 1 to 3 are described below as an example of a photoelectric conversion element according to an embodiment disclosed herein. In drawings used to describe embodiments, the same reference numerals will represent the same parts or corresponding parts.

Embodiment 1

(Configuration of Heterojunction Back-Contact Cell)

FIG. 1 shows a schematic enlarged plan view of the back surface of the heterojunction back-contact cell according to Embodiment 1. As shown in FIG. 1, the heterojunction back-contact cell according to Embodiment 1 includes a p-electrode 7 and n-electrodes 8 on the side of a back surface that is an example of a first surface of an n-type semiconductor substrate 1.

In an example shown in FIG. 1, the n-electrodes 8 have a rectangular island shape and the two n-electrodes 8 are arranged with a space therebetween so as to extend in the same direction. The p-electrode 7 is placed so as to surround each of the n-electrodes 8 with a space therebetween and forms a single electrode. Incidentally, in regions between the p-electrode 7 and the n-electrodes 8, a p-type amorphous semiconductor film 3 and an n-type amorphous semiconductor film 5 are exposed.

Figure 2:
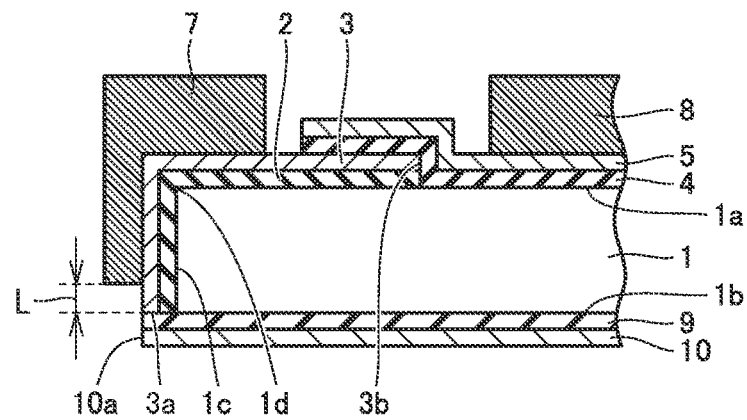
FIG. 2 is a schematic enlarged sectional view of the vicinity of an outer peripheral portion of the back surface of the heterojunction back-contact cell according to Embodiment 1 shown in FIG. 1.

FIG. 2 shows a schematic enlarged sectional view of the vicinity of an outer peripheral portion of the back surface of the heterojunction back-contact cell according to Embodiment 1 shown in FIG. 1. A first i-type amorphous semiconductor film 2, a p-type amorphous semiconductor film 3, and the p-electrode 7 are arranged on the outer peripheral portion 1d of the back surface 1a of the n-type semiconductor substrate 1 in that order. The first i-type amorphous semiconductor film 2, the p-type amorphous semiconductor film 3, and the p-electrode 7 extend over the outer peripheral portion 1d of the back surface 1a of the n-type semiconductor substrate 1 to a light-receiving surface 1b-side end portion of a side surface 1c of the n-type semiconductor substrate 1 and are located on the side surface 1c of the n-type semiconductor substrate 1.

In this embodiment, the following configuration is described: a configuration in which the first i-type amorphous semiconductor film 2, the p-type amorphous semiconductor film 3, and the p-electrode 7 are arranged on the whole outer peripheral portion 1d of the back surface 1a of the n-type semiconductor substrate 1 in that order. This embodiment is not limited to this configuration. In this embodiment, the outer peripheral portion 1d of the back surface 1a of the n-type semiconductor substrate 1 is a point on a line of intersection of the back surface 1a and side surface 1c of the n-type semiconductor substrate 1. In an example shown in FIG. 2, in the side surface 1c of the n-type semiconductor substrate 1, the first i-type amorphous semiconductor film 2 and the p-type amorphous semiconductor film 3 extend to be longer than the p-electrode 7 by a length L.

A second i-type amorphous semiconductor film 4, the n-type amorphous semiconductor film 5, and the n-electrodes 8 are arranged on an inside region opposite to the outer peripheral portion 1d side (outside) of the back surface 1a of the n-type semiconductor substrate 1 in that order. Herein, the outside edge of a stack of the second i-type amorphous semiconductor film 4 and the n-type amorphous semiconductor film 5 covers the inside edge of a stack of the first i-type amorphous semiconductor film 2 and the p-type amorphous semiconductor film 3.

A third i-type amorphous semiconductor film 9 and a second n-type amorphous semiconductor film 10 are arranged on a light-receiving surface 1b that is a second surface opposite to the back surface 1a that is the first surface of the n-type semiconductor substrate 1 in that order.

In the example shown in FIG. 2, one end 3a of the p-type amorphous semiconductor film 3 is in contact with the third i-type amorphous semiconductor film 9 and another end 3b of the p-type amorphous semiconductor film 3 is in contact with the second i-type amorphous semiconductor film 4. One end 10a of the second n-type amorphous semiconductor film 10 is not in contact with other members.

(Method for Manufacturing Heterojunction Back-Contact Cell)

Figure 3:
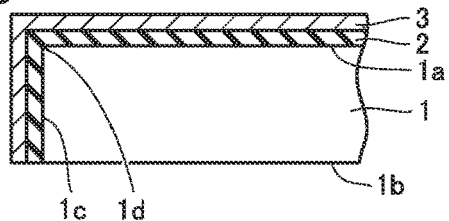
FIG. 3 is a schematic sectional view illustrating one of manufacturing steps of an example of the method for manufacturing the heterojunction back-contact cell according to Embodiment 1.

An example of a method for manufacturing the heterojunction back-contact cell according to Embodiment 1 is described below with reference to schematic sectional views in FIGS. 3 to 7. First, as shown in FIG. 3, the first i-type amorphous semiconductor film 2 is formed in contact with the whole back surface 1a of the n-type semiconductor substrate 1 so as to extend over the outer peripheral portion 1d of the back surface 1a of the n-type semiconductor substrate 1 to the light-receiving surface 1b-side end portion of the side surface 1c, followed by forming the p-type amorphous semiconductor film 3. A process for forming each of the first i-type amorphous semiconductor film 2 and the p-type amorphous semiconductor film 3 is not particularly limited and may be, for example, a plasma CVD process.

An n-type single-crystalline silicon substrate can be preferably used as the n-type semiconductor substrate 1. The n-type semiconductor substrate 1 is not limited to the n-type single-crystalline silicon substrate. For example, a conventionally known n-type semiconductor substrate can be appropriately used.

An i-type amorphous silicon film can be preferably used as the first i-type amorphous semiconductor film 2. The first i-type amorphous semiconductor film 2 is not limited to the i-type amorphous silicon film. For example, a conventionally known i-type amorphous semiconductor film can be used.

In this embodiment, the term "i type" includes not only a complete intrinsic state but also a state that an n- or p-type impurity is incorporated at a sufficiently low concentration (an n-type impurity concentration of less than $1 \times 10^{15}$ atoms/cm$^3$ and a p-type impurity concentration of less than $1 \times 10^{15}$ atoms/cm$^3$).

In this embodiment, the term "amorphous silicon" includes not only amorphous silicon in which no dangling bonds of silicon atoms are terminated with hydrogen but also hydrogenated amorphous silicon in which dangling bonds of silicon atoms are terminated with hydrogen.

A p-type amorphous silicon film can be preferably used as the p-type amorphous semiconductor film 3. The p-type amorphous semiconductor film 3 is not limited to the p-type amorphous silicon film. For example, a conventionally known p-type amorphous semiconductor film can be used.

For example, boron can be used as a p-type impurity contained in the p-type amorphous semiconductor film 3. In this embodiment, the term "p-type" means a state that the concentration of the p-type impurity is $1 \times 10^{15}$ atoms/cm$^3$ or more.

Figure 4:
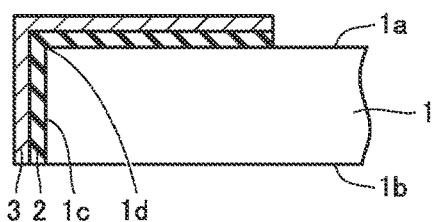
FIG. 4 is a schematic sectional view illustrating one of manufacturing steps of an example of the method for manufacturing the heterojunction back-contact cell according to Embodiment 1.

Next, as shown in FIG. 4, a portion of the stack of the first i-type amorphous semiconductor film 2 and the p-type amorphous semiconductor film 3 is removed. Herein, a portion of the stack of the first i-type amorphous semiconductor film 2 and the p-type amorphous semiconductor film 3, the portion being inside the back surface 1a of the n-type semiconductor substrate 1, is removed. This exposes a portion of a region inside the back surface 1a of the n-type semiconductor substrate 1 as shown in, for example, FIG. 4.

Figure 5:
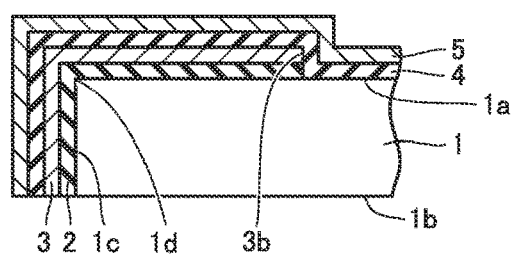
FIG. 5 is a schematic sectional view illustrating one of manufacturing steps of an example of the method for manufacturing the heterojunction back-contact cell according to Embodiment 1.

Next, as shown in FIG. 5, the second i-type amorphous semiconductor film 4 is formed in contact with each of an exposed surface of the back surface 1a of the n-type semiconductor substrate 1 and the stack of the first i-type amorphous semiconductor film 2 and the p-type amorphous semiconductor film 3, followed by forming the n-type amorphous semiconductor film 5. A process for forming each of the second i-type amorphous semiconductor film 4 and the n-type amorphous semiconductor film 5 is not particularly limited and may be, for example, a plasma CVD process. Incidentally, the second i-type amorphous semiconductor film 4 is formed such that the other end 3b of the p-type amorphous semiconductor film 3 is in contact with the second i-type amorphous semiconductor film 4.

An i-type amorphous silicon film can be preferably used as the second i-type amorphous semiconductor film 4. The second i-type amorphous semiconductor film 4 is not limited to the i-type amorphous silicon film. For example, a conventionally known i-type amorphous semiconductor film can be used.

An n-type amorphous silicon film can be preferably used as the n-type amorphous semiconductor film 5. The n-type amorphous semiconductor film 5 is not limited to the n-type amorphous silicon film. For example, a conventionally known n-type amorphous semiconductor film can be used.

For example, phosphorus can be used as an n-type impurity contained in the n-type amorphous semiconductor film 5. In this embodiment, the term "n type" means a state that the concentration of the n-type impurity is $1 \times 10^{15}$ atoms/cm$^3$ or more.

Figure 6:
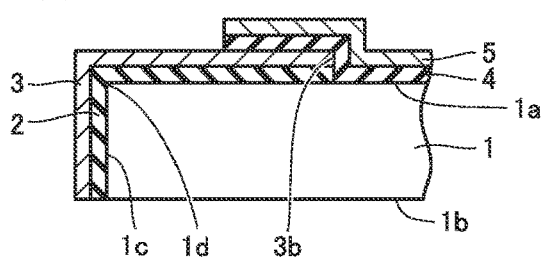
FIG. 6 is a schematic sectional view illustrating one of manufacturing steps of an example of the method for manufacturing the heterojunction back-contact cell according to Embodiment 1.

Next, as shown in FIG. 6, a portion of the stack of the second i-type amorphous semiconductor film 4 and the n-type amorphous semiconductor film 5 is removed. Herein, a portion of the stack of the stack of the second i-type amorphous semiconductor film 4 and the n-type amorphous semiconductor film 5, the portion being outside the back surface 1a of the n-type semiconductor substrate 1, is removed. In an example shown in FIG. 6, this exposes the p-type amorphous semiconductor film 3 such that the p-type amorphous semiconductor film 3 extends over the outer peripheral portion 1d of the back surface 1a of the n-type semiconductor substrate 1 to the light-receiving surface 1b-side end portion of the side surface 1c and allows the stack of the second i-type amorphous semiconductor film 4 and the n-type amorphous semiconductor film 5 to be formed inside the back surface 1a of the n-type semiconductor substrate 1 in a rectangular island shape.

Figure 7:
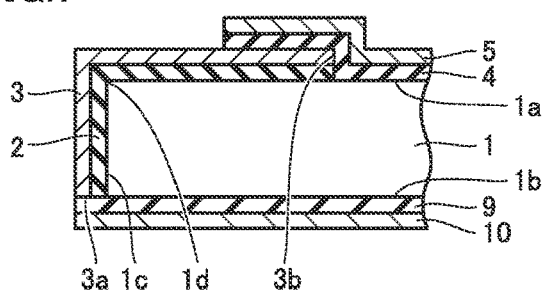
FIG. 7 is a schematic sectional view illustrating one of manufacturing steps of an example of the method for manufacturing the heterojunction back-contact cell according to Embodiment 1.

Next, as shown in FIG. 7, the third i-type amorphous semiconductor film 9 is formed in contact with the light-receiving surface 1b of the n-type semiconductor substrate 1 and an end surface of the stack of the first i-type amorphous semiconductor film 2 and the p-type amorphous semiconductor film 3 on the side surface 1c of the n-type semiconductor substrate 1, followed by forming the second n-type amorphous semiconductor film 10. A process for forming each of the third i-type amorphous semiconductor film 9 and the second n-type amorphous semiconductor film 10 is not particularly limited and may be, for example, a plasma CVD process. In an example shown in FIG. 7, the third i-type amorphous semiconductor film 9 is formed such that the one end 3a of the p-type amorphous semiconductor film 3 is in contact with the third i-type amorphous semiconductor film 9.

Thereafter, as shown in FIG. 1, the p-electrode 7 is formed on the p-type amorphous semiconductor film 3 and the n-electrodes 8 are formed on the n-type amorphous semiconductor film 5, whereby the heterojunction back-contact cell according to Embodiment 1 can be manufactured.

Herein, in this embodiment, the p-electrode 7 is formed so as to extend over the outer peripheral portion 1d of the back surface 1a of the n-type semiconductor substrate 1 to the side surface 1c and is formed in contact with the p-type amorphous semiconductor film 3 so as not to be longer than the p-type amorphous semiconductor film 3. The n-electrodes 8 are formed in contact with the n-type amorphous semiconductor film 5, which has a rectangular island shape. The p-electrode 7 is formed so as to surround the n-electrodes 8 with a space therebetween.

Figure 15:
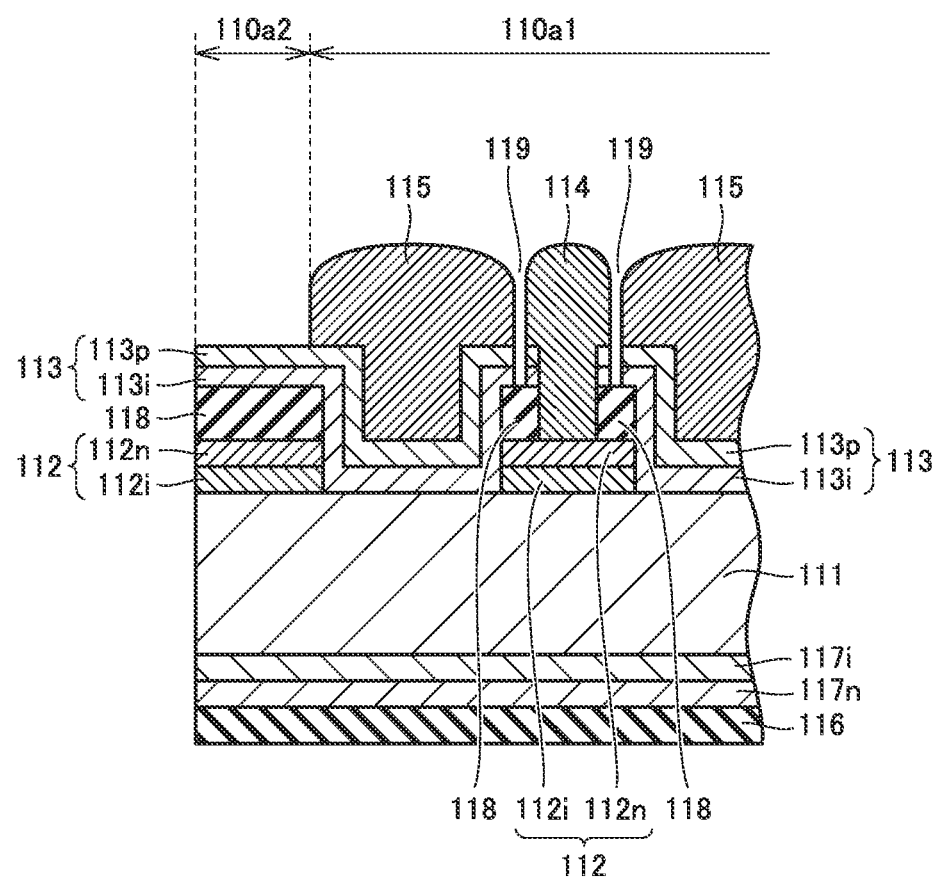
FIG. 15 is a schematic sectional view of a conventional back contact-type solar cell.

Unlike the conventional back contact-type solar cell shown in FIG. 15, in the heterojunction back-contact cell according to Embodiment 1, the p-electrode 7 is electrically connected to the p-type amorphous semiconductor film 3 and the p-electrode 7 and the p-type amorphous semiconductor film 3 are placed so as to extend over the outer peripheral portion 1d of the back surface 1a of the n-type semiconductor substrate 1 onto the side surface 1c. Thus, the heterojunction back-contact cell according to Embodiment 1 can increase the amount of a collected current as compared to the conventional back contact-type solar cell shown in FIG. 15 and therefore can increase the photoelectric conversion efficiency more than ever before. From the viewpoint of increasing the amount of a collected current to increase the photoelectric conversion efficiency as compared to the conventional back contact-type solar cell shown in FIG. 15, the p-type amorphous semiconductor film 3 and the p-electrode 7 may extend over the outer peripheral portion 1d of the back surface 1a of the n-type semiconductor substrate 1 to at least one region of at least one side surface 1c of the n-type semiconductor substrate 1.

In the heterojunction back-contact cell according to Embodiment 1, the p-electrode 7, which is placed above the outer peripheral portion 1d of the back surface 1a of the n-type semiconductor substrate 1, is placed so as to surround the n-electrodes 8 with a space therebetween; hence, the p-electrode 7 and the n-electrodes 8 can be electrically separated from each other inside the back surface 1a of the n-type semiconductor substrate 1. This eliminates the need to pattern an electrode outside the back surface 1a of the n-type semiconductor substrate 1 with high precision, enables the occurrence of short circuiting due to a failure to pattern an electrode located outside the back surface 1a of the n-type semiconductor substrate 1 to be reduced, and therefore leads to an increase in photoelectric conversion efficiency.

Furthermore, in the heterojunction back-contact cell according to Embodiment 1, the p-electrode 7 is formed on a peripheral region including the outer peripheral portion 1d of the back surface 1a of the n-type semiconductor substrate 1, thereby enabling the electrode-forming area of the back surface 1a of the n-type semiconductor substrate 1 to be increased. Therefore, in a type of photoelectric conversion element in which a p-n junction is formed by forming an amorphous semiconductor film on the back surface 1a of the n-type semiconductor substrate 1, the carrier collection efficiency is increased, a current can be efficiently extracted, and the resistance of an electrode can be reduced. This enables the photoelectric conversion efficiency of the heterojunction back-contact cell according to Embodiment 1 to be increased.

Embodiment 2

Figure 8:
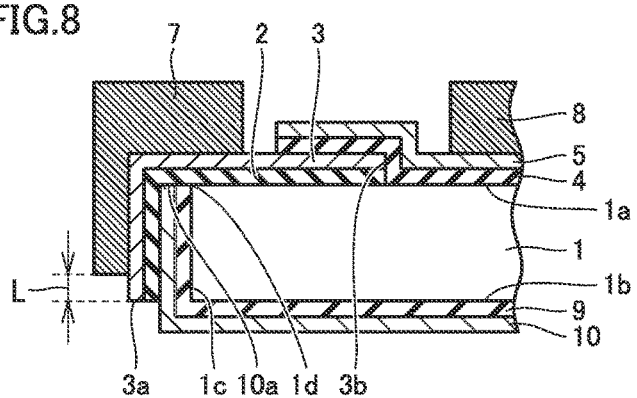
FIG. 8 is a schematic enlarged sectional view of the vicinity of an outer peripheral portion of the back surface of a heterojunction back-contact cell according to Embodiment 2.

FIG. 8 shows a schematic enlarged sectional view of the vicinity of an outer peripheral portion of the back surface of a heterojunction back-contact cell according to Embodiment 2. The heterojunction back-contact cell according to Embodiment 2 is characterized in that the configuration of the vicinity of the outer peripheral portion is different from that of the heterojunction back-contact cell according to Embodiment 1.

As shown in FIG. 8, in the heterojunction back-contact cell according to Embodiment 2, a third i-type amorphous semiconductor film 9 and a second n-type amorphous semiconductor film 10 are placed to extend onto a side surface 1c of an n-type semiconductor substrate 1. The third i-type amorphous semiconductor film 9, the second n-type amorphous semiconductor film 10, a first i-type amorphous semiconductor film 2, and a p-type amorphous semiconductor film 3 are arranged on the side surface 1c of the n-type semiconductor substrate 1 in that order. Furthermore, one end 3a of the p-type amorphous semiconductor film 3 is not in contact with the third i-type amorphous semiconductor film 9 and one end 10a of the second n-type amorphous semiconductor film 10 is in contact with the first i-type amorphous semiconductor film 2.

Figure 9:
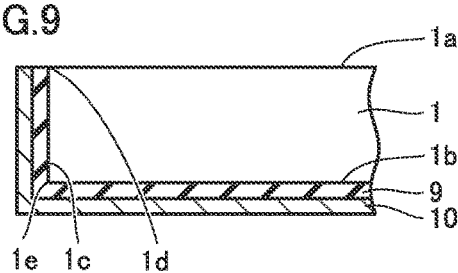
FIG. 9 is a schematic sectional view illustrating one of manufacturing steps of an example of a method for manufacturing the heterojunction back-contact cell according to Embodiment 2.

An example of a method for manufacturing the heterojunction back-contact cell according to Embodiment 2 is described below with reference to schematic sectional views in FIGS. 9 to 12. First, as shown in FIG. 9, the third i-type amorphous semiconductor film 9 is formed in contact with the whole of a light-receiving surface 1b of the n-type semiconductor substrate 1 so as to extend over an outer peripheral portion 1e of the light-receiving surface 1b to a back surface 1a-side end portion of the side surface 1c, followed by forming the second n-type amorphous semiconductor film 10. A process for forming each of the third i-type amorphous semiconductor film 9 and the second n-type amorphous semiconductor film 10 is not particularly limited and may be, for example, a plasma CVD process. Incidentally, the outer peripheral portion 1e of the light-receiving surface 1b of the n-type semiconductor substrate 1 is a point on a line of intersection of the light-receiving surface 1b and the side surface 1c.

Figure 10:
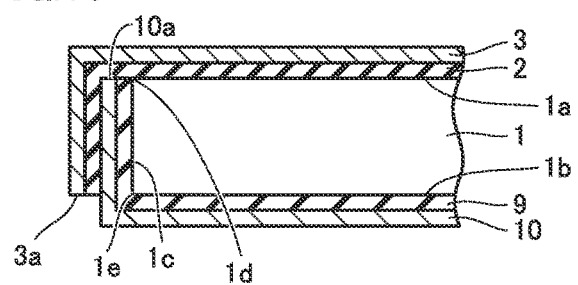
FIG. 10 is a schematic sectional view illustrating one of manufacturing steps of an example of the method for manufacturing the heterojunction back-contact cell according to Embodiment 2.

Next, as shown in FIG. 10, the first i-type amorphous semiconductor film 2 is formed so as to cover the back surface 1a of the n-type semiconductor substrate 1 and a stack of the third i-type amorphous semiconductor film 9 and the second n-type amorphous semiconductor film 10, the stack being on the side surface 1c, followed by forming the p-type amorphous semiconductor film 3. Herein, the p-type amorphous semiconductor film 3 is formed such that the one end 3a of the p-type amorphous semiconductor film 3 is not in contact with the third i-type amorphous semiconductor film 9. The first i-type amorphous semiconductor film 2 is formed such that the one end 10a of the second n-type amorphous semiconductor film 10 is in contact with the first i-type amorphous semiconductor film 2.

Figure 11:
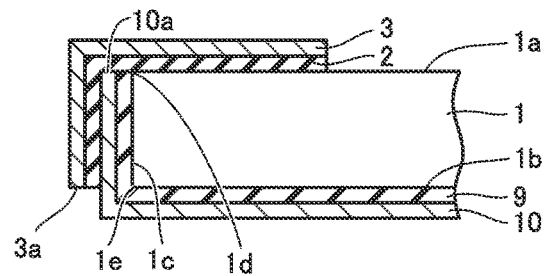
FIG. 11 is a schematic sectional view illustrating one of manufacturing steps of an example of the method for manufacturing the heterojunction back-contact cell according to Embodiment 2.

Next, as shown in FIG. 11, a portion of a stack of the first i-type amorphous semiconductor film 2 and the p-type amorphous semiconductor film 3, the portion being inside the back surface 1a of the n-type semiconductor substrate 1, is removed. This exposes a portion of a region inside the back surface 1a of the n-type semiconductor substrate 1 as shown in, for example, FIG. 11.

Figure 12:
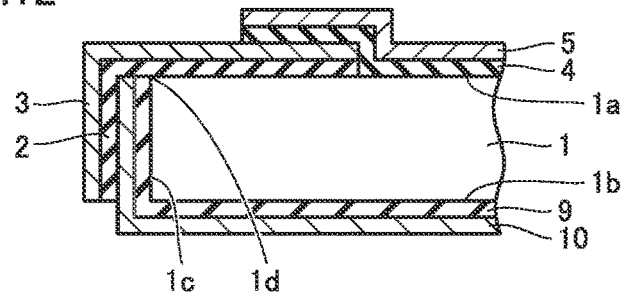
FIG. 12 is a schematic sectional view illustrating one of manufacturing steps of an example of the method for manufacturing the heterojunction back-contact cell according to Embodiment 2.

Next, as shown in FIG. 12, the second i-type amorphous semiconductor film 4 is formed in contact with each of an exposed surface of the back surface 1a of the n-type semiconductor substrate 1 and the stack of the first i-type amorphous semiconductor film 2 and the p-type amorphous semiconductor film 3, followed by forming the n-type amorphous semiconductor film 5.

Thereafter, as shown in FIG. 8, a p-electrode 7 is formed on the p-type amorphous semiconductor film 3 and n-electrodes 8 are formed on the n-type amorphous semiconductor film 5, whereby the heterojunction back-contact cell according to Embodiment 2 can be manufactured.

Descriptions of Embodiment 2 other than the above are substantially the same as those of Embodiment 1 and therefore are not repeated.

Embodiment 3

Figure 13:
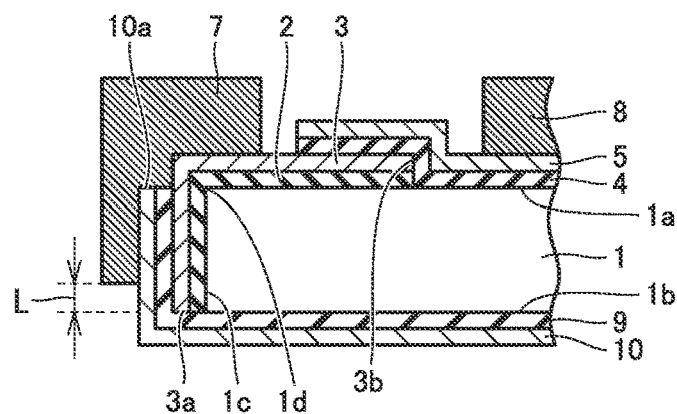
FIG. 13 is a schematic enlarged sectional view of the vicinity of an outer peripheral portion of the back surface of a heterojunction back-contact cell according to Embodiment 3.

FIG. 13 shows a schematic enlarged sectional view of the vicinity of an outer peripheral portion of the back surface of a heterojunction back-contact cell according to Embodiment 3. The heterojunction back-contact cell according to Embodiment 3 is characterized in that the configuration of the vicinity of the outer peripheral portion is different from that of the heterojunction back-contact cell according to each of Embodiments 1 and 2.

As shown in FIG. 13, in the heterojunction back-contact cell according to Embodiment 3, a third i-type amorphous semiconductor film 9 and a second n-type amorphous semiconductor film 10 are placed so as to extend onto a side surface 1c of an n-type semiconductor substrate 1. A first i-type amorphous semiconductor film 2, a p-type amorphous semiconductor film 3, the third i-type amorphous semiconductor film 9, and the second n-type amorphous semiconductor film 10 are arranged on the side surface 1*c* of the n-type semiconductor substrate 1 in that order. Furthermore, one end 3*a* of the p-type amorphous semiconductor film 3 is in contact with the third i-type amorphous semiconductor film 9 and one end 10*a* of the second n-type amorphous semiconductor film 10 is not in contact with the first i-type amorphous semiconductor film 2 but is in contact with a p-electrode 7.

Figure 14:
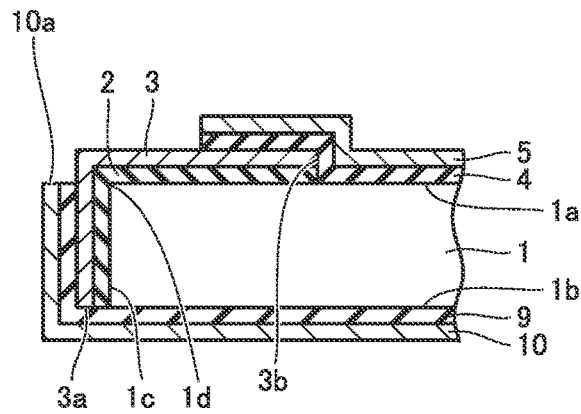
FIG. 14 is a schematic sectional view illustrating one of manufacturing steps of an example of a method for manufacturing the heterojunction back-contact cell according to Embodiment 3.

An example of a method for manufacturing the heterojunction back-contact cell according to Embodiment 3 is described below with reference to a schematic sectional view in FIG. 14. Steps shown in FIGS. 3 to 6 are substantially the same as those described in Embodiment 1. Thereafter, as shown in FIG. 14, the third i-type amorphous semiconductor film 9 is formed so as to cover a light-receiving surface 1*b* of the n-type semiconductor substrate 1 and a stack of the first i-type amorphous semiconductor film 2 and the p-type amorphous semiconductor film 3, the stack being on the side surface 1*c*, followed by forming the second n-type amorphous semiconductor film 10. Herein, the p-type amorphous semiconductor film 3 is formed such that the one end 3*a* of the p-type amorphous semiconductor film 3 is in contact with the third i-type amorphous semiconductor film 9. The first i-type amorphous semiconductor film 2 is formed such that the one end 10*a* of the second n-type amorphous semiconductor film 10 is not in contact with the first i-type amorphous semiconductor film 2.

Thereafter, as shown in FIG. 13, the p-electrode 7 is formed on the p-type amorphous semiconductor film 3 and n-electrodes 8 are formed on the n-type amorphous semiconductor film 5, whereby the heterojunction back-contact cell according to Embodiment 3 can be manufactured.

Descriptions of Embodiment 3 other than the above are substantially the same as those of Embodiment 1 and therefore are not repeated.

APPENDICES (1) An embodiment disclosed herein provides a photoelectric conversion element including an n-type semiconductor substrate, a p-type amorphous semiconductor film on the side of a first surface and side surface of the semiconductor substrate, an n-type amorphous semiconductor film on the first surface side of the semiconductor substrate, a p-electrode on the p-type amorphous semiconductor film, and an n-electrode on the n-type amorphous semiconductor film. The p-electrode is located on the p-type amorphous semiconductor film, which is placed on the first surface side and side surface of the semiconductor substrate. In this case, the amount of a collected current can be increased as compared to conventional back contact-type solar cells and therefore the photoelectric conversion efficiency can be increased more than ever before.

(2) In the photoelectric conversion element according to the embodiment disclosed herein, in a side surface of the semiconductor substrate, the p-type amorphous semiconductor film may extend to be longer than the p-electrode. In this case, the amount of a collected current can be increased as compared to conventional back contact-type solar cells and therefore the photoelectric conversion efficiency can be increased more than ever before.

(3) In the photoelectric conversion element according to the embodiment disclosed herein, the n-electrode may have an island shape. In this case, the amount of a collected current can be increased as compared to conventional back contact-type solar cells and therefore the photoelectric conversion efficiency can be increased more than ever before.

(4) In the photoelectric conversion element according to the embodiment disclosed herein, the n-electrode may have a rectangular shape. In this case, the amount of a collected current can be increased as compared to conventional back contact-type solar cells and therefore the photoelectric conversion efficiency can be increased more than ever before.

(5) In the photoelectric conversion element according to the embodiment disclosed herein, the p-electrode may surround the n-electrode with a space therebetween. In this case, the amount of a collected current can be increased as compared to conventional back contact-type solar cells and therefore the photoelectric conversion efficiency can be increased more than ever before.

(6) The photoelectric conversion element according to the embodiment disclosed herein may further include a first i-type amorphous semiconductor film between the semiconductor substrate and the p-type amorphous semiconductor film and a second i-type amorphous semiconductor film between the semiconductor substrate and the n-type amorphous semiconductor film. In this case, the amount of a collected current can be increased as compared to conventional back contact-type solar cells and therefore the photoelectric conversion efficiency can be increased more than ever before.

(7) The photoelectric conversion element according to the embodiment disclosed herein may further include a second n-type amorphous semiconductor film on the side of a second surface opposite to the first surface of the semiconductor substrate. In this case, the amount of a collected current can be increased as compared to conventional back contact-type solar cells and therefore the photoelectric conversion efficiency can be increased more than ever before.

(8) The photoelectric conversion element according to the embodiment disclosed herein may further include a third i-type amorphous semiconductor film between the semiconductor substrate and the second n-type amorphous semiconductor film. In this case, the amount of a collected current can be increased as compared to conventional back contact-type solar cells and therefore the photoelectric conversion efficiency can be increased more than ever before.

(9) In the photoelectric conversion element according to the embodiment disclosed herein, an end of the p-type amorphous semiconductor film may be in contact with the third i-type amorphous semiconductor film. In this case, the amount of a collected current can be increased as compared to conventional back contact-type solar cells and therefore the photoelectric conversion efficiency can be increased more than ever before.

(10) In the photoelectric conversion element according to the embodiment disclosed herein, another end of the p-type amorphous semiconductor film may be in contact with the second i-type amorphous semiconductor film. In this case, the amount of a collected current can be increased as compared to conventional back contact-type solar cells and therefore the photoelectric conversion efficiency can be increased more than ever before.

(11) In the photoelectric conversion element according to the embodiment disclosed herein, the second n-type amorphous semiconductor film and the third i-type amorphous semiconductor film may be located on a side surface of the semiconductor substrate. In this case, the amount of a collected current can be increased as compared to conventional back contact-type solar cells and therefore the photoelectric conversion efficiency can be increased more than ever before.

(12) In the photoelectric conversion element according to the embodiment disclosed herein, the third i-type amorphous semiconductor film, the second n-type amorphous semiconductor film, the first i-type amorphous semiconductor film, and the p-type amorphous semiconductor film may be arranged on a side surface of the semiconductor substrate in that order. In this case, the amount of a collected current can be increased as compared to conventional back contact-type solar cells and therefore the photoelectric conversion efficiency can be increased more than ever before.

(13) In the photoelectric conversion element according to the embodiment disclosed herein, an end of the p-type amorphous semiconductor film need not be in contact with the third i-type amorphous semiconductor film and an end of the second n-type amorphous semiconductor film may be in contact with the first i-type amorphous semiconductor film. In this case, the amount of a collected current can be increased as compared to conventional back contact-type solar cells and therefore the photoelectric conversion efficiency can be increased more than ever before.

(14) In the photoelectric conversion element according to the embodiment disclosed herein, the first i-type amorphous semiconductor film, the p-type amorphous semiconductor film, the third i-type amorphous semiconductor film, and the second n-type amorphous semiconductor film may be arranged on a side surface of the semiconductor substrate in that order. In this case, the amount of a collected current can be increased as compared to conventional back contact-type solar cells and therefore the photoelectric conversion efficiency can be increased more than ever before.

(15) In the photoelectric conversion element according to the embodiment disclosed herein, an end of the p-type amorphous semiconductor film may be in contact with the third i-type amorphous semiconductor film and an end of the second n-type amorphous semiconductor film need not be in contact with the first i-type amorphous semiconductor film. In this case, the amount of a collected current can be increased as compared to conventional back contact-type solar cells and therefore the photoelectric conversion efficiency can be increased more than ever before.

(16) An embodiment disclosed herein provides a method for manufacturing a photoelectric conversion element, the method including a step of forming a p-type amorphous semiconductor film on the side of a first surface of an n-type semiconductor substrate, a step of forming an n-type amorphous semiconductor film on the first surface side of the semiconductor substrate, a step of forming a p-electrode on the p-type amorphous semiconductor film, and a step of forming an n-electrode on the n-type amorphous semiconductor film, the p-electrode and the p-type amorphous semiconductor film being formed so as to extend onto a side surface of the semiconductor substrate. In this case, the amount of a collected current can be increased as compared to conventional back contact-type solar cells and therefore the photoelectric conversion efficiency can be increased more than ever before.

(17) In the method for manufacturing the photoelectric conversion element according to the embodiment disclosed herein, in a side surface of the semiconductor substrate, the p-type amorphous semiconductor film may be formed so as to extend to be longer than the p-electrode. In this case, the amount of a collected current can be increased as compared to conventional back contact-type solar cells and therefore the photoelectric conversion efficiency can be increased more than ever before.

(18) In the method for manufacturing the photoelectric conversion element according to the embodiment disclosed herein, the n-electrode may be formed so as to have an island shape. In this case, the amount of a collected current can be increased as compared to conventional back contact-type solar cells and therefore the photoelectric conversion efficiency can be increased more than ever before.

(19) In the method for manufacturing the photoelectric conversion element according to the embodiment disclosed herein, the n-electrode may be formed so as to have a rectangular shape. In this case, the amount of a collected current can be increased as compared to conventional back contact-type solar cells and therefore the photoelectric conversion efficiency can be increased more than ever before.

(20) In the method for manufacturing the photoelectric conversion element according to the embodiment disclosed herein, the p-electrode may be formed so as to surround the n-electrode with a space therebetween. In this case, the amount of a collected current can be increased as compared to conventional back contact-type solar cells and therefore the photoelectric conversion efficiency can be increased more than ever before.

(21) In the method for manufacturing the photoelectric conversion element according to the embodiment disclosed herein, the step of forming the p-type amorphous semiconductor film may include a step of subsequently forming a first i-type amorphous semiconductor film and the p-type amorphous semiconductor film on the first surface side of the semiconductor substrate and the step of forming the n-type amorphous semiconductor film may include a step of subsequently forming a second i-type amorphous semiconductor film and the n-type amorphous semiconductor film on the first surface side of the semiconductor substrate. In this case, the amount of a collected current can be increased as compared to conventional back contact-type solar cells and therefore the photoelectric conversion efficiency can be increased more than ever before.

(22) The method for manufacturing the photoelectric conversion element according to the embodiment disclosed herein may further include a step of forming a second n-type amorphous semiconductor film on the side of a second surface opposite to the first surface of the semiconductor substrate. In this case, the amount of a collected current can be increased as compared to conventional back contact-type solar cells and therefore the photoelectric conversion efficiency can be increased more than ever before.

(23) In the method for manufacturing the photoelectric conversion element according to the embodiment disclosed herein, the step of forming the second n-type amorphous semiconductor film may further include a step of a third i-type amorphous semiconductor film between the semiconductor substrate and the second n-type amorphous semiconductor film. In this case, the amount of a collected current can be increased as compared to conventional back contact-type solar cells and therefore the photoelectric conversion efficiency can be increased more than ever before.

(24) In the method for manufacturing the photoelectric conversion element according to the embodiment disclosed herein, the step of forming the third i-type amorphous semiconductor film may be performed after the step of forming the p-type amorphous semiconductor film and the third i-type amorphous semiconductor film may be formed such that an end of the p-type amorphous semiconductor film is in contact with the third i-type amorphous semiconductor film. In this case, the amount of a collected current can be increased as compared to conventional back contact-type solar cells and therefore the photoelectric conversion efficiency can be increased more than ever before.

(25) In the method for manufacturing the photoelectric conversion element according to the embodiment disclosed herein, the step of forming the n-type amorphous semiconductor film may be performed after the step of forming the p-type amorphous semiconductor film and the second i-type amorphous semiconductor film may be formed such that another end of the p-type amorphous semiconductor film is in contact with the second i-type amorphous semiconductor film. In this case, the amount of a collected current can be increased as compared to conventional back contact-type solar cells and therefore the photoelectric conversion efficiency can be increased more than ever before.

(26) In the method for manufacturing the photoelectric conversion element according to the embodiment disclosed herein, the second n-type amorphous semiconductor film and the third i-type amorphous semiconductor film may be formed so as to be located on a side surface of the semiconductor substrate. In this case, the amount of a collected current can be increased as compared to conventional back contact-type solar cells and therefore the photoelectric conversion efficiency can be increased more than ever before.

(27) In the method for manufacturing the photoelectric conversion element according to the embodiment disclosed herein, the step of forming the p-type amorphous semiconductor film may be performed after the step of forming the third i-type amorphous semiconductor film and may be performed such that the third i-type amorphous semiconductor film, the second n-type amorphous semiconductor film, the first i-type amorphous semiconductor film, and the p-type amorphous semiconductor film are arranged on a side surface of the semiconductor substrate in that order. In this case, the amount of a collected current can be increased as compared to conventional back contact-type solar cells and therefore the photoelectric conversion efficiency can be increased more than ever before.

(28) In the method for manufacturing the photoelectric conversion element according to the embodiment disclosed herein, the p-type amorphous semiconductor film may be formed such that an end of the p-type amorphous semiconductor film is not in contact with the third i-type amorphous semiconductor film and the first i-type amorphous semiconductor film may be formed such that an end of the second n-type amorphous semiconductor film is in contact with the first i-type amorphous semiconductor film. In this case, the amount of a collected current can be increased as compared to conventional back contact-type solar cells and therefore the photoelectric conversion efficiency can be increased more than ever before.

(29) In the method for manufacturing the photoelectric conversion element according to the embodiment disclosed herein, the step of forming the p-type amorphous semiconductor film may be performed before the step of forming the third i-type amorphous semiconductor film and may be performed such that the first i-type amorphous semiconductor film, the p-type amorphous semiconductor film, the third i-type amorphous semiconductor film, and the second n-type amorphous semiconductor film are arranged on a side surface of the semiconductor substrate in that order. In this case, the amount of a collected current can be increased as compared to conventional back contact-type solar cells and therefore the photoelectric conversion efficiency can be increased more than ever before.

(30) In the method for manufacturing the photoelectric conversion element according to the embodiment disclosed herein, the p-type amorphous semiconductor film may be formed such that an end of the p-type amorphous semiconductor film is not in contact with the third i-type amorphous semiconductor film and the first i-type amorphous semiconductor film may be formed such that an end of the second n-type amorphous semiconductor film is not in contact with the first i-type amorphous semiconductor film. In this case, the amount of a collected current can be increased as compared to conventional back contact-type solar cells and therefore the photoelectric conversion efficiency can be increased more than ever before.

Embodiments have been described above. From the outset, it has been planned to appropriately combine the configurations of the above-mentioned embodiments.

Embodiments disclosed herein are for exemplification and should not in any way be construed as limitative. The scope of the present invention is defined by the appended claims rather than the foregoing description and is intended to include all modifications within the sense and scope equivalent to the appended claims.

INDUSTRIAL APPLICABILITY

Embodiments disclosed herein can be applied to photoelectric conversion elements and methods for manufacturing the photoelectric conversion elements, may be preferably applicable to solar cells and method for manufacturing the solar cells, and may be particularly preferably applicable to heterojunction back-contact cells and method for manufacturing the heterojunction back-contact cells.

REFERENCE SIGNS LIST

1 N-type semiconductor substrate, 1a Back surface, 1b Light-receiving surface, 1c Side surface, 1d Outer peripheral portion, 2 First i-type amorphous semiconductor film, 3 P-type amorphous semiconductor film, 3a One end, 3b Other end, 4 Second i-type amorphous semiconductor film, 5 N-type amorphous semiconductor film, 7 P-electrode, 8 N-electrodes, 9 Third i-type amorphous semiconductor film, 10 Second n-type amorphous semiconductor film, 110a1 Region, 110a2 Peripheral portion, 111 Crystalline semiconductor substrate, 112 IN stack, 112i I-type amorphous semiconductor layer, 112n N-type amorphous semiconductor layer, 113 IP stack, 113i I-type amorphous semiconductor layer, 113p P-type amorphous semiconductor layer, 114 N-side electrode, 115 P-side electrodes, 116 Insulating layer, 117i I-type amorphous semiconductor layer, 117n N-type amorphous semiconductor layer, 118 Insulating layer, 119 Trenches

The invention claimed is:

1. A photoelectric conversion element comprising:
an n-type semiconductor substrate;
a p-type amorphous semiconductor film on a first surface and a side surface of the n-type semiconductor substrate;
an n-type amorphous semiconductor film on the first surface of the n-type semiconductor substrate;
a p-electrode on the p-type amorphous semiconductor film; and
an n-electrode on the n-type amorphous semiconductor film,
wherein the p-electrode is located on the p-type amorphous semiconductor film, which is placed on the first surface and the side surface of the n-type semiconductor substrate, and
wherein in the side surface of the n-type semiconductor substrate, the p-type amorphous semiconductor film extends to be longer than the p-electrode.

2. The photoelectric conversion element according to claim 1, wherein the n-electrode has an island shape.

3. The photoelectric conversion element according to claim 2, wherein the p-electrode surrounds the n-electrode with a space therebetween.

4. The photoelectric conversion element according to claim 1, further comprising:
- a first i-type amorphous semiconductor film between the n-type semiconductor substrate and the p-type amorphous semiconductor film; and
- a second i-type amorphous semiconductor film between the n-type semiconductor substrate and the n-type amorphous semiconductor film.

* * * * *